United States Patent [19]

Kawano et al.

[11] Patent Number: 5,696,655
[45] Date of Patent: Dec. 9, 1997

[54] SELF-BIASING NON-MAGNETIC GIANT MAGNETORESISTANCE

[75] Inventors: Masaya Kawano, Tokyo, Japan; Stuart A. Solin, Princeton Junction; Tineke Thio, Princeton, both of N.J.

[73] Assignee: NEC Research Institute, Inc., Princeton, N.J.

[21] Appl. No.: 688,583

[22] Filed: Jul. 30, 1996

[51] Int. Cl.$^6$ ................................................ G11B 5/39
[52] U.S. Cl. ................................................ 360/113
[58] Field of Search ................................ 360/113, 125, 360/126; 338/32 R; 324/252; 428/611

[56] References Cited

U.S. PATENT DOCUMENTS

| | | | |
|---|---|---|---|
| 3,569,895 | 3/1971 | Fujisada | 338/14 |
| 3,617,975 | 11/1971 | Wieder | 338/32 |
| 4,926,226 | 5/1990 | Heremans et al. | 257/424 |
| 5,442,508 | 8/1995 | Smith | 360/113 |
| 5,476,680 | 12/1995 | Coffey et al. | 427/130 |
| 5,502,325 | 3/1996 | Sokolich et al. | 257/421 |
| 5,510,172 | 4/1996 | Araki et al. | 360/113 |
| 5,563,752 | 10/1996 | Komuro et al. | 360/113 |
| 5,583,725 | 12/1996 | Coffey et al. | 360/113 |
| 5,587,235 | 12/1996 | Suzuki et al. | 360/113 |
| 5,594,933 | 1/1997 | Hayashi et al. | 428/546 |

*Primary Examiner*—Jefferson Evans
*Attorney, Agent, or Firm*—Jeffery J. Brosemer

[57] ABSTRACT

A self-biasing, non-magnetic giant magnetoresistive sensor constructed from a thin film of inhomogeneous magnetoresistive material showing Giant Magnetresistance (GMR) at T=300° K., e.g., Mercury Cadmium Telluride. In one embodiment, the sensor has a silicon substrate, a layer of inhomogeneous magnetoresistive material, e.g., $Hg_{1-x}Cd_xTe$, and electrodes attached to the non-homogeneous magnetoresistive layer. Alternatively, a buffer layer of, e.g., CdTe may overlay the substrate. In another embodiment, the sensor is an active element of a read/write head, particularly well suited for reading information signals stored in a magnetic medium.

8 Claims, 4 Drawing Sheets

SELF-BIASING NON-MAGNETIC GIANT MAGNETORESISTANCE

FIELD OF THE INVENTION

The present invention relates generally to sensors for reading information signals recorded in a magnetic medium and, more particularly, to a self-biasing, non-magnetic giant magnetoresistance (GMR) sensor.

BACKGROUND OF THE INVENTION

Various types of sensors exhibiting magnetoresistive characteristics are known and implemented in systems for the reading of information signals recorded in a magnetic medium such as tapes, drums and diskettes. These sensors typically comprise a block made of a ferromagnetic alloy exhibiting high magnetoresistance. A recording medium passing in close proximity to such a sensor causes variations in the magnetic field at the position of the read head, and hence variations of the electrical resistance of the magnetoresistive sensor. The alloys most frequently used are nickel-based ferromagnetic alloys such as NiCo or NiFe (Permalloy) which have high magnetoresistance but which, at ambient temperatures, give a relative variation in resistance of only a few percent at the relevant (average) magnetic fields (~50 G) accessible to those particular sensors.

Recently however, magnetoresistive sensors have been described exhibiting a form of magnetoresistance generally known as "spin-valve" (SV) magnetoresistance, in which the change in resistance of the sensor is attributed to the spin-dependent transmission of conduction electrons between the magnetic layers of the sensor and the accompanying spin-dependent scattering at the layer interfaces. In such a sensor, the magnetoresistance is observed to vary as the cosine of the angle between the magnetizations of the layers and is dependent of the direction of current flow through the sensor. Yet while such sensors do exhibit a magnetoresistance that, for selected combinations of materials, is greater in magnitude than that exhibited by the alloy magnetoresistors (AMR), they too suffer from having a relatively small variation in magnetoresistance at ambient temperatures.

More recently, magnetoresistive sensors for reading/writing information signals stored on a magnetic medium have been described in copending applications Ser. No. 08/396,819 filed on Mar. 2, 1995 and Ser. No. 08/435,254 filed on May 5, 1995, each assigned to the same assignee as the instant application and incorporated herein by reference.

Magnetoresistive sensors are normally fabricated with a thin overlayer of hard magnetic material to provide a bias field required for optimum performance. The bias field can serve a number of purposes including: a) pre-aligning the spins in a polycrystalline sensor such as permalloy, b) shifting the operation of the detector to a region in which the field dependence of the resistance, R(H), is increased relative to that at H=0, c) shifting to a region of increased linearity and/or d) in the case of detectors with a symmetric response where R(H)=R(-H), providing the necessary asymmetry to sense the field direction.

As shown in the prior art for magnetoresistive sensors incorporating Mercury Cadmium Telluride (MCT) as the magnetoresistive element, a bias field is required to introduce an asymmetry in the field response. Therefore, the fabrication, design and construction of an MCT field sensor could be greatly simplified if the material was self-biasing, especially if the self-biasing field could be controlled in the fabrication process.

SUMMARY OF THE INVENTION

The present invention is a self-biasing, non-magnetic giant magnetoresistive sensor constructed from a thin film of non-homogeneous magnetoresistive material, i.e., Mercury Cadmium Telluride. The thin film may be advantageously grown using a variety of techniques.

Viewed from one aspect, the present invention is directed to such a self-biasing, non-magnetic magnetoresistive sensor having a silicon substrate, a buffer layer of undoped CdTe or other lattice-matched compound overlying the substrate, a non-homogeneous magnetoresistive layer, i.e., $Hg_{1-x}Cd_xTe$, and electrodes attached to the non-homogeneous layer.

Viewed from another aspect, the present invention is directed to a read/write head containing a self-biasing, non-magnetic magnetoresistive sensor having a Corbino structure, particularly well suited for reading information signals stored in a magnetic medium with high storage density.

DETAILED DESCRIPTION

A detailed description of the invention will now be presented while referring to the figures, several of which may be simultaneously referred to during the course of the following description.

Figure 1A:
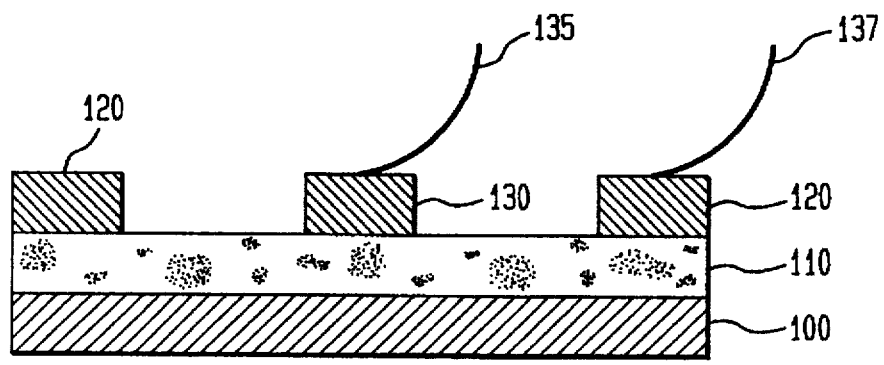
FIG. 1(a) is a cross-sectional view of a magnetoresistive sensor of the present invention.
Figure 1B:
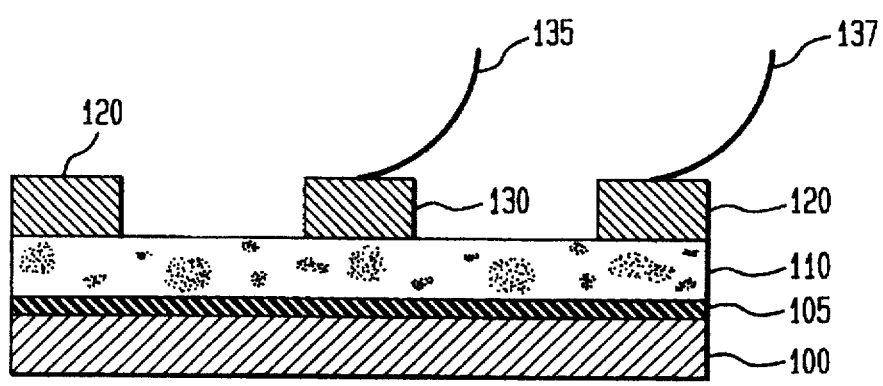
FIG. 1(b) is a cross-sectional view of an alternative embodiment of the magnetoresistive sensor of FIG. 1(a)

FIGS. 1(a) and 1(b) show a Corbino disc-type magnetoresistive sensor of the present invention. A non-homogeneous magnetoresistive layer 110 was deposited upon a semiconductor substrate 100. Preferably, the non-homogeneous layer may be made of Mercury Cadmium Telluride, $Hg_{1-x}Cd_xTe$, where x varies throughout the material thereby imparting the non-homogeneous characteristic. Those skilled in the art will readily recognize that other, alternative non-homogeneous magnetoresistive materials may be satisfactorily used as well. Conductive electrodes 120, 130 were applied to the magnetoresistive layer by standard photolithographic techniques. Leads, 135, 137 may then be attached to the electrodes by any of a variety of conductive means, e.g., conductive epoxy cement or gold/bonding wire. Advantageously, and as shown in FIG. 1(b), buffer layer 105 may be applied between the substrate and the non-homogeneous magnetoresistive layer. The buffer layer may be made of any material compatible with the substrate and the magnetoresistive layer, e.g., Cadmium Telluride.

Representative $Hg_{1-x}Cd_xTe$ films were grown on single crystal Si substrates by conventional molecular-beam epitaxy (MBE) techniques using methods well known in the art. A 4 μm buffer layer of undoped CdTe separated the substrate and the 4.6 μm thick $Hg_{1-x}Cd_xTe$ layer in the sensor depicted by FIG. 1(b).

Figure 1C:
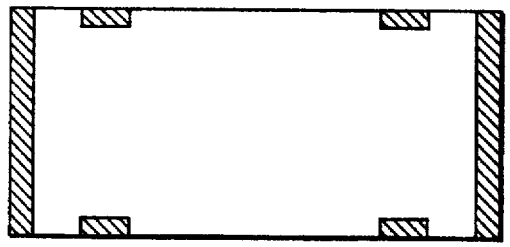
FIG. 1(c) and 1(d) are plan views of alternative embodiments of a magnetoresistive sensor of the present invention, namely a Hall Bar and Corbino Disc, respectively.
Figure 1D:
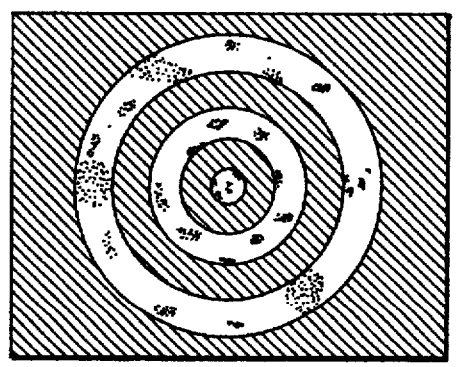

FIGS. 1(c) and 1(d) show plan views of magnetoresistive sensors (Hall bar and Corbino disc) which have been constructed according to the present invention.

In order to impart a better understanding of the operation of the invention to those skilled in the art, the following discussion is provided.

Figure 3:
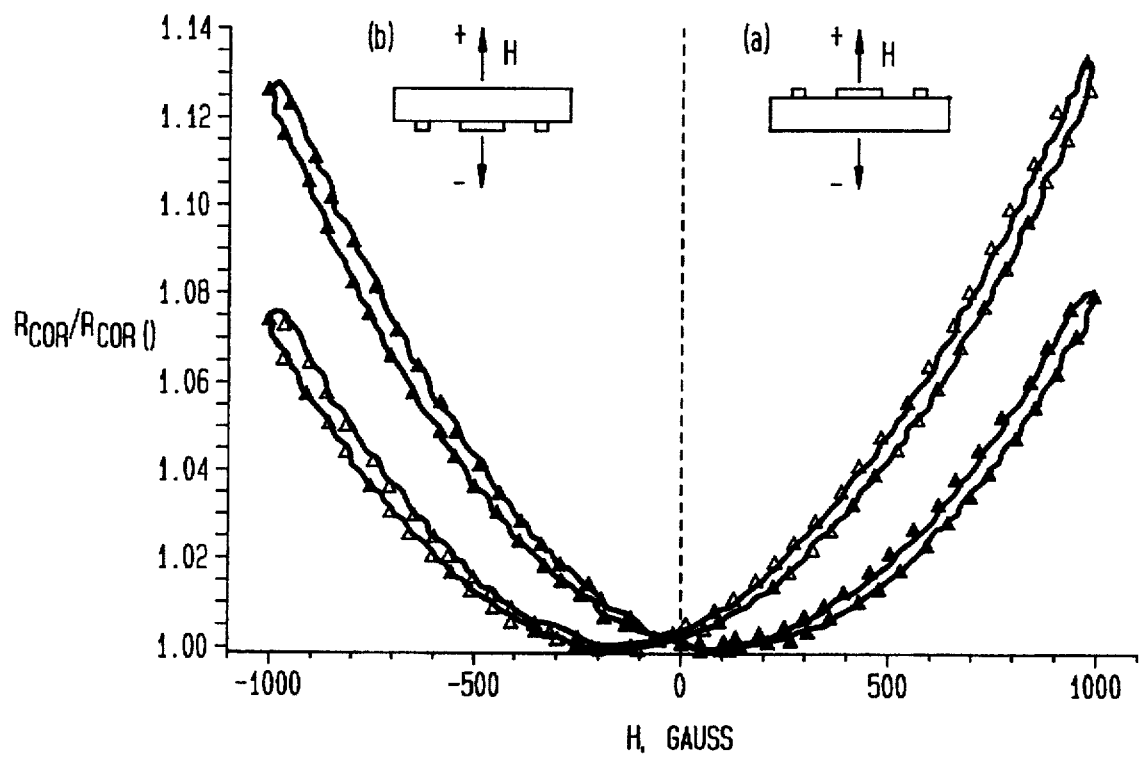
FIG. 3 shows the magnetoresistance of a Corbino disc constructed according to the teachings of the present invention, having (a) normal orientation relative to the applied field (open triangles) and (b) inverted orientation (solid triangles) at T=300° K.

In FIG. 3 is shown the room temperature low-field (H<0.1 T) GMR measured in the Corbino disc geometry. As expected, the GMR, defined hereafter as $R_{Cor}(H)/R_{Cor}(0)$ where $R_{Cor}(H)$, is quadratic in field (see below). However, contrary to expectation, the GMR is not symmetric in the applied field about H=0. For the measurement configuration shown in the right panel inset of FIG. 3, there is a zero-field offset, $H_o$—145 Gauss of the minimum in the GMR while for the "inverted" configuration shown in the left panel inset $H_o$ is of the same magnitude but opposite sign. This offset is much larger than the remnant magnetic field in the superconducting magnet (~20 G). More significantly, because the offset changes sign when the sample is inverted in the magnetic field, it cannot be attributed to a remanent field but rather is an effect intrinsic to the sample. The zero-field offset, $H_0$, constitutes a self-biasing of the Corbino device. Before identifying the origin of this self biasing effect it will be useful to describe additional measurements of the magnetotransport properties.

In order to gain insight into the zero-field offset, the low-field GMR was measured as a function of temperature, and fitted at each temperature to a parabolic dependence on the magnetic field. The position of the minimum, $H_o$, is plotted in FIG. 4 as a function of temperature. The offset is largest at high temperature, and decreases to a value of order the remnant field at low temperature. For the Corbino discs measured, the temperature dependence of $H_o$ is similar, but the magnitude at room temperature varies between 100 and 350 G.

Figure 5:
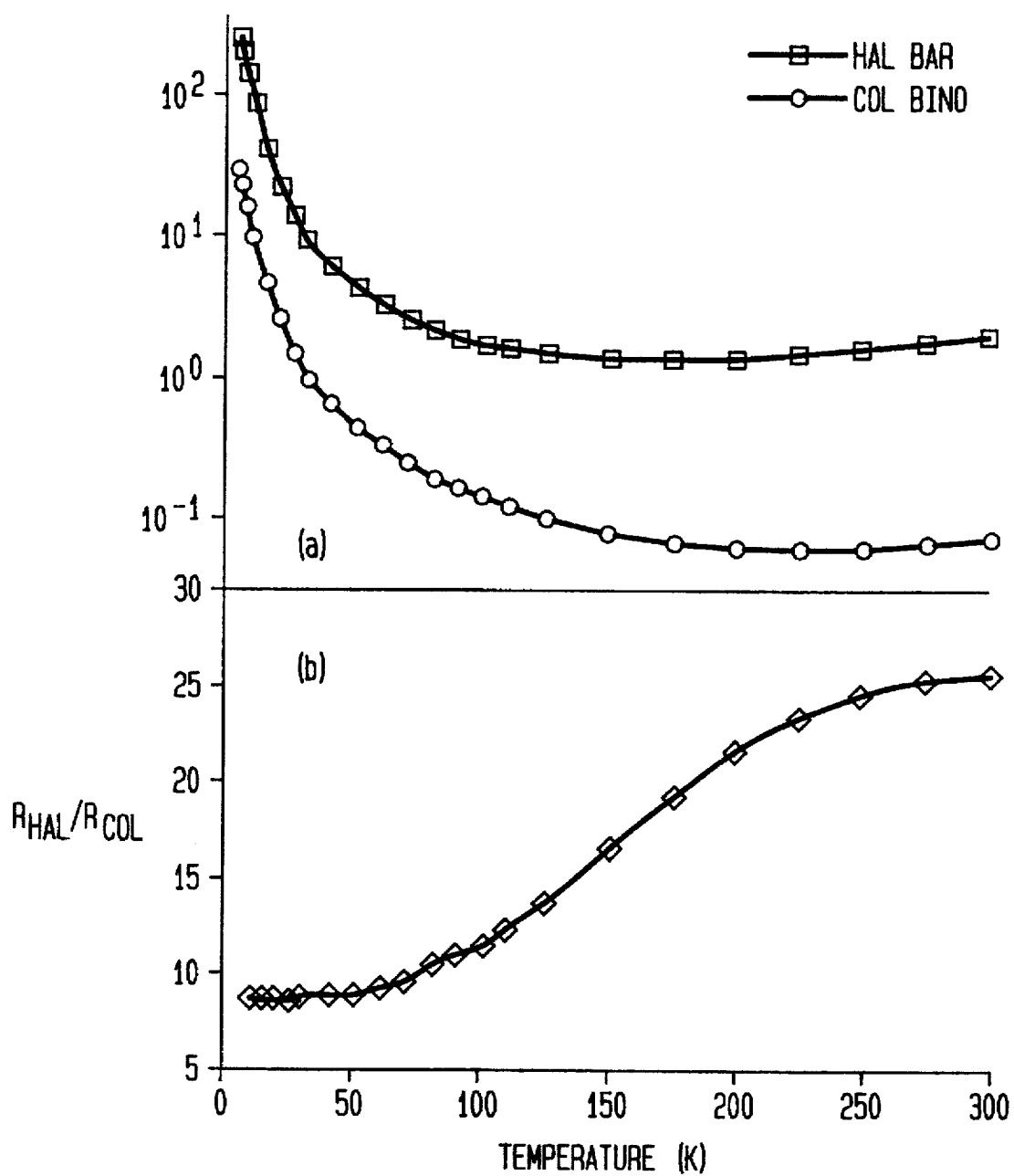
FIG. 5 is a graph showing the temperature dependence of (a) zero-field resistance of a Hall bar (squares) and Corbino disc (circles), and (b) their ratio (diamonds).

A surprising result is also found in a comparison of the temperature dependence of the zero-field resistances in the Hall bar and Corbino geometries, as shown in FIG. 5(a). For both types of sample R(T) decreases slightly on cooling from room temperature, reaches a minimum, and increases on further cooling. However, the minima of R(T) do not occur at the same temperature for the two geometries—as becomes explicitly clear with reference to FIG. 5(b), which shows that the ratio of the zero-field resistances of the two samples varies by a factor ~3 over the temperature range of the experiment.

The sample resistances are given by $R_j(T)=C_j\rho(T)$ where $\rho(T)$ is the temperature-dependent resistivity of the MCT. The subscripts j=Cor, Hall denote respectively the Corbino and Hall-bar geometries; the geometric factors are $$C_{Cor} = \frac{1}{2\pi t} \ln(r_b/r_a),$$

and $C_{Hall}=l/A$. Here $r_b(r_a)$ is the outer (inner) radius of the Corbino disc and t is the MCT film thickness, while l (A) is the length (cross-sectional area) of the Hall bar. Thus, one would expect the ratio $R_{Hall}(T)/R_{Cor}(T)$ to be strictly constant in temperature. The large variation of this ratio therefore suggests that the temperature dependences of the resistivities are different in the two samples despite the fact that they originate from sites whose centers are only 1.5 cm apart in the original wafer on which the MCT was grown. This in turn points to a possible spatial inhomogeneity in the MCT epilayer on the scale of ~1 cm, the size of the Corbino disc. Furthermore, it can be shown that such an inhomogeneity can account for the experimental results described above in the following way.

Suppose there are local regions of reduced conductivity between the voltage rings (the two inner rings) of a Corbino disc. A Hall field can develop in these regions because space charge can build up on the edges. This will result in a Hall contribution to the voltage measured across the Corbino voltage rings. The field-dependent Corbino voltage in the presence of the inhomogeneities is given by:

$$V_{Cor} = IR_{Cor}(1 + \alpha H^2), \quad (1)$$

where I is the radial current in the CD, H is the applied field perpendicular to the CD, $\alpha = (e\tau/m^*c)^2$ and $$R_{Cor} = \frac{C_{Cor}\rho_{oCor}}{\left[1 + \left\{ \left(\frac{\Delta\rho}{\rho_{oCor}} \frac{A_{Hall}}{A_{Cor}}\right) / \left(1 - \frac{\Delta\rho}{\rho_{oCor}} \frac{C^l_{Hall}}{C_{Cor}}\right) \right\}\right]}. \quad (2)$$

Here $\Delta\rho = \rho_{oCor} - \rho_{oHall}$, $-\infty < \Delta\rho \leq \rho_{oCor}$, and $\rho_{oCor}$, $A_{Cor}$, are the resistivity and area of the homogeneous Corbino region with the corresponding values for the inhomogeneous (Hall) regions designated by the subscript Hall. The effective Hall geometric factor is now designated $C_{Hall}^l$ because it depends on the shape and distribution of the inhomogeneous regions. Note that for a fully homogeneous Corbino disc, $\Delta\rho = 0$ and $R_{Cor} = C_{Cor} \rho_{oCor}$.

Let $V_{Hall}$ be the effective Hall voltage from all of the inhomogeneous regions. Then $$V_{Hall} = <R_{Hall}>IHC_{Hall}^l \frac{\Delta\rho}{\rho_{oCor}}, \quad (3)$$

where $<R_{Hall}>$ is an effective Hall coefficient of the inhomogeneous regions. By superposition, the voltages given by (1) and (3) add or subtract depending on the direction of the magnetic field and the total voltage is $$V_T(H) = IR_{Cor}(1 + \alpha H^2) + <R_{Hall}>IHC_{Hall}^l \frac{\Delta\rho}{\rho_{oCor}}. \quad (4)$$

For a constant current measurement such as the ones performed, the GMR is then given by $$GMR = \frac{V_T(H)}{V_T(0)} = 1 + \alpha H^2 + \beta H, \quad (5)$$

where $$\beta = \frac{<R_{Hall}>C_{Hall}^l \frac{\Delta\rho}{\rho_{oCor}}}{R_{Cor}}. \quad (6)$$

From Eq. (5) the field offset, $H_0$, is found to be $$H_0 = -\frac{\beta}{2\alpha}. \quad (7)$$

Since α is positive the sign of β and therefore of $H_0$ is determined by the sign of $\Delta\rho$. Thus for the normal configuration shown in the right panel insert of FIG. 3, a negative $\Delta\rho$ gives a negative offset while the inverted configuration for which H→−H gives a positive offset of equal magnitude. As noted above, the data of FIG. 3 have been fit using the quadratic form given in Eq. (5). With sufficiently detailed knowledge of the spatial distribution and magnitude of the inhomogeneities, it is in principle possible to compute the effective Hall coefficient and geometric factor. However, without this knowledge one cannot extract the magnitude of the resistivity fluctuation from the value of β obtained from the fits to the data.

Figure 4:
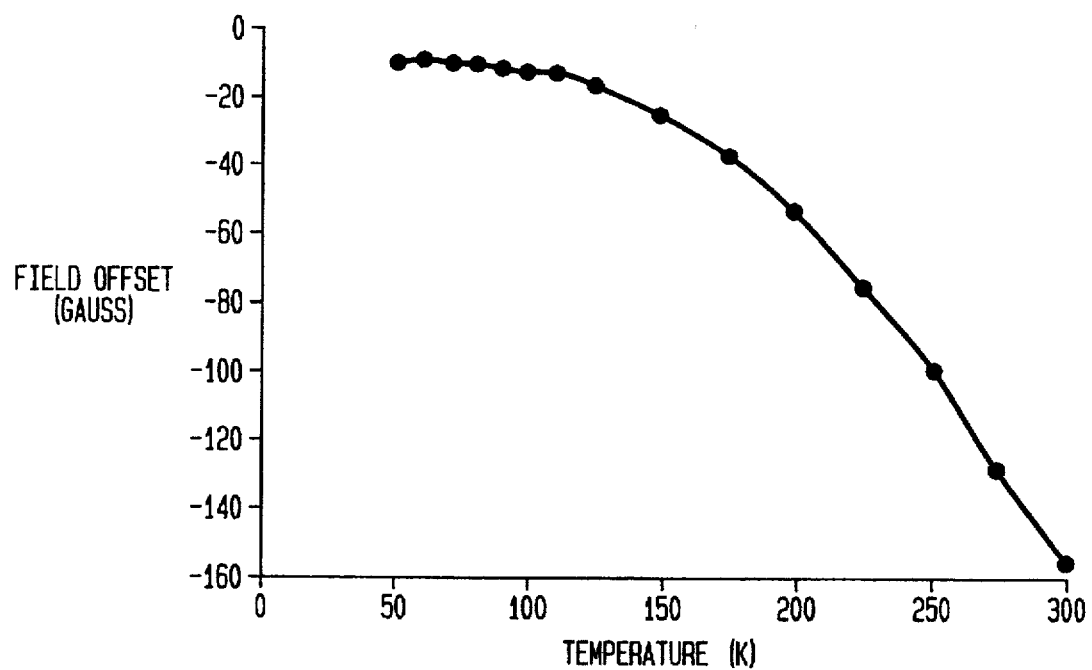
FIG. 4 shows the temperature dependence of magnetic field offset $H_o$ in the Corbino disc magnetoresistance.

Consider now the temperature dependence of $H_0$ shown in FIG. 4. The offset decreases to zero with decreasing temperature. It is also found that the more inhomogeneous the sample is (by visual observation), the lower is its Corbino resistance and the larger is its offset. These observations are also consistent with an inhomogeneity in the MCT film. Such inhomogeneities may arise from fluctuations in the composition, x, or from fluctuations in the density of acceptor states associated with Cd or Hg vacancies that are known to be present in unannealed MCT.

First the effect of composition fluctuations will be discussed. Within the accuracy of the composition measurements, $\Delta x = \pm 0.01$, the intrinsic electron concentration at 300K can vary by $\sim \pm 15\%$. In addition, the electron mobility fluctuation corresponding to this composition change is of order $\pm 2\%$ at $x \sim 0.1$ and 300K. Thus the resistivity fluctuation corresponding to the composition uncertainty is of order $\pm 17\%$. In the regions of the MCT film where x is smaller than that corresponding to zero energy gap at room temperature, the resistivity will be lower. Thus the more inhomogeneous the sample, the larger is $\Delta\rho$ and the lower will be its Corbino resistance, $R_{Cor}$, as can be seen from Eq. (2). This is consistent with experimental observations. Furthermore, Hall studies show that for $T < \sim 150K$ the holes associated with Hg vacancies become the majority carriers whose concentration and mobility at H=0 are both approximately temperature-independent. At low temperature the resistivity in the regions of lower x is the same as that in the rest of the sample. The resistivity fluctuations vanish, i.e. $\Delta\rho \rightarrow 0$ so $\beta \rightarrow 0$ at low temperature and the magnitude of $H_0$ decreases, as observed in the data of FIG. 4.

Consider further the situation where there are acceptor concentration fluctuations without composition fluctuations. At high temperature, the regions of the sample including those with enhanced or decreased Hg or Cd vacancy densities will be intrinsic, in which case $\Delta\rho \rightarrow 0$. Only at low temperature where the acceptor concentration determines the carrier density and thus the resistivity will the fluctuations be appreciable. Thus spatial variations in the Hg or Cd vacancy density would give rise to an offset which was minimal at room temperature and maximal at low temperature, in contrast to our observations.

We now address the temperature dependence of the Corbino and Hall bar resistance ratio shown in FIG. 5(b). These measurements were made on a companion pair of samples originating from within 1.5 cm of one another on the wafer. If the material of the CD and the Hall bar were identical the ratio of their resistances would be constant since it would depend only on temperature independent geometric factors. We therefore attribute the observed factor of three variation to lateral inhomogeneity in the MCT film on the scale of ~1 cm.

The Corbino disc data in FIG. 5(a) may be used to determine the thermal coefficient of resistance of MCT which is defined as:

$$\left(\frac{\Delta R}{R}\right) \%/K = 100 \left[\frac{R(300) - R(T)}{R(300)}\right] / (300 - T). \quad (8)$$

A value of 0.26%/K is found which is approximately equal to the corresponding value for currently available commercial magnetic MR sensors (0.238%/K) but larger than that of spin valves (0.169%/K). It may be possible to increase the thermal stability of MCT by increasing the acceptor concentration to raise the temperature of the saturation region to room temperature. Alternatively, by deliberate doping with electrons and/or holes, it may be possible to achieve the condition $[dR(T)/dT] \sim 0$, $T_1 < 300 < T_2$ over the temperature range $T_2 - T_1$ around room temperature and thereby minimize the thermal coefficient in that range.

Figure 2A:
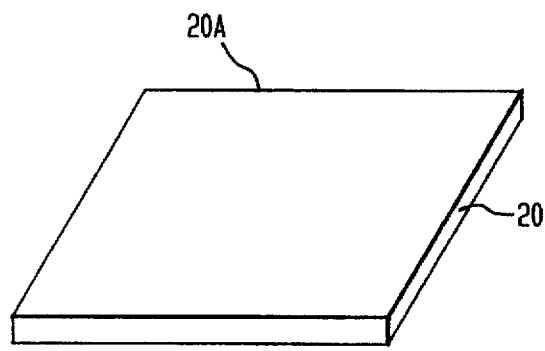
FIGS. 2A–2G illustrate, in perspective, a read/write head sensor being fabricated in various stages of its preparation in accordance with an illustrative embodiment of the invention.
Figure 2B:
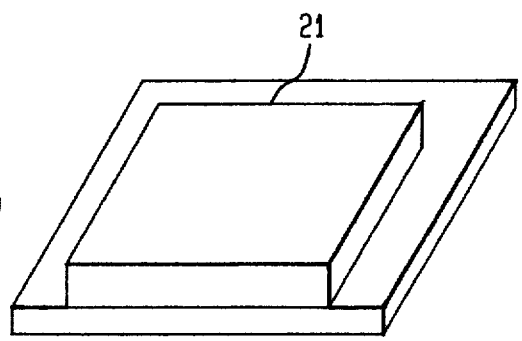

In accordance with one embodiment of the present invention, the active element position on the reading head is prepared as follows. First, there is prepared a suitable substrate 20, as shown in FIG. 2A, advantageously of a semiconductor such as silicon, gallium arsenide or other material upon which there can be grown subsequent layers. A top surface 20A of the substrate may be doped or coated to be sufficiently conductive to serve well as one terminal of the sensor. There is then deposited over the substrate surface, a first layer 21, which may advantageously be the same semiconductive material as the substrate, though essentially undoped. Advantageously, and as shown in FIG. 2B, this layer is deposited to be essentially monocrystalline. As shown in FIG. 2B, layer 21 is patterned to be narrower and shorter than the substrate. The patterning may be performed through the use of techniques well-known in the microelectronics industry such as photolithography and etching.

Figure 2C:
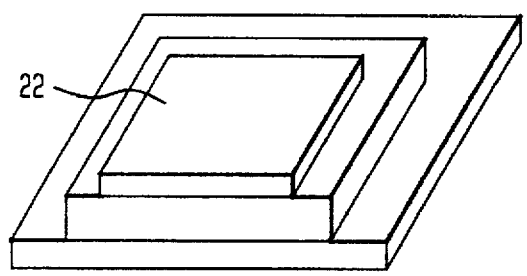

Next, and as shown in FIG. 2C, there is deposited a second layer 22 which is narrower and shorter than the first layer 21. This second layer 22 is a material having desirable magnetoresistive properties, such as zero-gap mercury cadmium telluride or mercury zinc telluride. Advantageously, this layer may be grown as a highly crystalline layer.

Figure 2D:
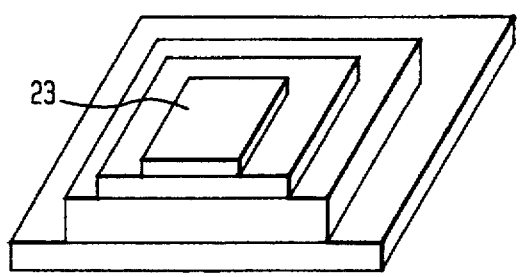

As shown in FIG. 2D, there is next deposited a third layer 23 of a conductive material, such as a molybdenum-gold alloy that will make good ohmic connection to the second layer. This third layer is deposited and patterned to be narrower than the second layer 22.

Figure 2E:
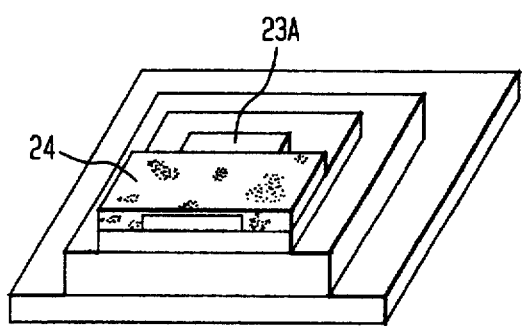

Next, and as shown in FIG. 2E, a fourth layer 24 of magnetoresistive material is deposited to bridge the metallic layer 23 and form a continuous loop of magnetoresistive material around the conductive third layer 23. This fourth layer, while made from the same general magnetoresistive material as the second layer 22, has sufficient compositional variation from the second layer material such that a continuous, yet inhomogeneous loop of magnetoresistive material surrounds the conductive layer. As an example, if the second layer 22 were made from MCT having the general formula $Hg_{1-x}Cd_xTe$ where $x \sim 0.1$, then the fourth layer may be made from MCT having the general formula $Hg_{1-x}Cd_xTe$ where x varies thoughout the fourth layer or where $x_{second\ layer} \neq x_{fourth\ layer}$. This fourth layer is patterned, as shown, so that the metallic layer is centered within the loop but there is left exposed an end portion 23A of the conductive layer 23 to which a terminal connection may subsequently be made.

Figure 2F:
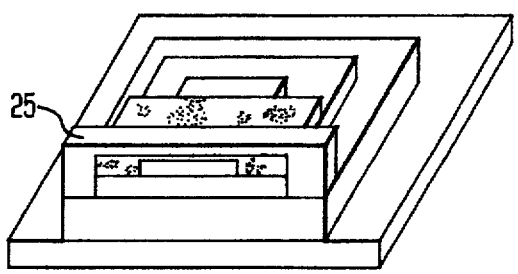
Figure 2G:
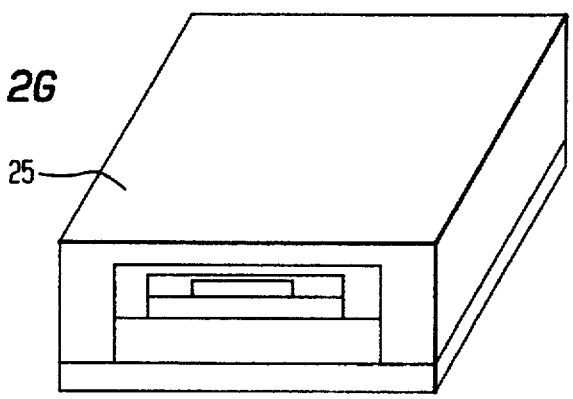

Next, as shown in FIG. 2F, there is deposited a fifth layer 25, advantageously of the same material as the first layer 21, and is patterned to form a bridge over the fourth layer 24 and a continuous loop that surrounds the fourth layer 24. Advantageously there is left uncovered the portion 23A of the conductive layer 23 until a terminal connection has been made to the uncovered portion.

The basic elements of the magnetoresistive sensor are now essentially in place. There remains the need to diffuse an impurity into the exposed front face of the stack to dope the exposed front edge of the loop of undoped semiconductor formed of the first and fifth layers (21,25) to a conductive state so that the doped loop can serve as the conductive outer electrode of the Corbino structure.

Clearly, it should now be quite evident to those skilled in the art, that while the invention was shown and described in detail in the context of a preferred embodiment, and with various modifications thereto, a wide variety of other modifications can be made without departing from the scope of the inventive teachings which should only be limited by the following claims.

I claim:

1. A sensor with a magnetoresistive effect for sensing magnetic patterns, stored as a series of magnetic domains in a storage device, said sensor comprising:

a substrate;

an inhomogeneous layer of magnetoresistive material overlying said substrate wherein said inhomogeneous layer of magnetoresistive material is substantially Mercury Cadmium Telluride $Hg_{1-x}Cd_xTe$; and a plurality of electrodes, attached to said inhomogeneous layer of magnetoresistive material.

2. The magnetoresistive sensor according to claim 1 further comprising a buffer layer interposed between said substrate and said inhomogeneous magnetoresistive layer.

3. The magnetoresistive sensor according to claim 2 wherein said buffer layer is substantially Cadmium Telluride.

4. A magnetoresistive sensor for sensing magnetic patterns stored as a series of magnetic domains in a storage device comprising:

an inhomogeneous semiconductive wafer of magnetoresistive material having at least one planar surface wherein said inhomogeneous semiconductive wafer is constructed from Mercury Cadmium Telluride;

electrode means including an inner electrode and an outer electrode surrounding the inner electrode on the planar surface of the inhomogeneous semiconductive material; and means for supporting the planar surface of the inhomogeneous semiconductive wafer of magnetoresistive material adjacent to the magnetic patterns stored on the storage device.

5. The magnetoresistive sensor according to claim 4 further comprising:

buffer means positioned between said supporting means and said inhomogeneous semiconductor wafer.

6. A method for making a sensor with magnetoresistive effect for sensing magnetic patterns stored as a series of magnetic domains on a storage device comprising:

forming on a conductive surface of a substrate a first layer of semiconductive material that is of high resistivity;

forming on a limited portion of said first layer a second layer of a material that exhibits a magnetoresistive effect;

forming on a limited portion of said second layer a third layer of high conductivity;

forming over said third layer an inhomogeneous fourth layer that is generally of the same material as said second layer and that joins with the second layer to form a loop enclosing a front end portion of the third layer;

forming a fifth layer that is of the same material as the first layer and that joins with the first layer to form a loop enclosing a front end portion of the second, third and fourth layers; and diffusing into a front edge portion of said first and fifth layers a dopant of a type to increase the conductivity of the diffused regions of the first and fifth layers with essentially little effect on the resistivity of the second and fourth layers for forming a conductive loop around the second and fourth layers for use as the outer electrode of a Corbino structure, the third layer forming the inner electrode of the Corbino structure.

7. The method according to claim 6 wherein said second layer and said inhomogeneous fourth layer are Mercury Cadmium Telluride $Hg_{1-x}Cd_xTe$ and x varies throughout the inhomogeneous fourth layer thereby imparting the inhomogeneity.

8. The method according to claim 6 wherein said second layer and said inhomogeneous fourth layer are Mercury Cadmium Telluride $Hg_{1-x}Cd_xTe$ and the value of x for the second layer is not the same as the value of x for the fourth layer thereby imparting the inhomogeneity.

* * * * *